(12) United States Patent
Witter et al.

(10) Patent No.: US 11,198,932 B2
(45) Date of Patent: Dec. 14, 2021

(54) METHOD FOR PRODUCING A SLIDING SURFACE

(71) Applicant: Schaeffler Technologies AG & Co. KG, Herzogenaurach (DE)

(72) Inventors: Oliver Witter, Westhausen (DE); Klaus Feldner, Zirndorf (DE); Stefan Dupke, Ködnitz (DE); Holger Pätzold, Burgebrach (DE); Frank Schlerege, Herzogenaurach (DE); Serge Kursawe, Uttenreuth (DE)

(73) Assignee: Schaeffler Technologies AG & Co. KG, Herzogenaurach (DE)

( * ) Notice: Subject to any disclaimer, the term of this patent is extended or adjusted under 35 U.S.C. 154(b) by 205 days.

(21) Appl. No.: 16/616,839

(22) PCT Filed: Mar. 23, 2018

(86) PCT No.: PCT/DE2018/100262
§ 371 (c)(1),
(2) Date: Nov. 25, 2019

(87) PCT Pub. No.: WO2018/224073
PCT Pub. Date: Dec. 13, 2018

(65) Prior Publication Data
US 2021/0292884 A1    Sep. 23, 2021

(30) Foreign Application Priority Data

Jun. 7, 2017 (DE) ..................... 10 2017 112 466.7

(51) Int. Cl.
| | | |
|---|---|---|
| *C23C 14/06* | (2006.01) | |
| *C23C 14/58* | (2006.01) | |
| *C23C 16/56* | (2006.01) | |
| *C23C 16/26* | (2006.01) | |

(Continued)

(52) U.S. Cl.
CPC ...... *C23C 14/0605* (2013.01); *C23C 14/5813* (2013.01); *C23C 16/26* (2013.01);
(Continued)

(58) Field of Classification Search
CPC . C23C 14/0605; C23C 14/5813; C23C 16/26; C23C 16/56; F01L 1/14; F01L 1/16
(Continued)

(56) References Cited

U.S. PATENT DOCUMENTS 5,980,997 A     11/1999  Ross et al.
11,072,040 B2 *  7/2021  Patzold ................ B23K 26/359
(Continued)

FOREIGN PATENT DOCUMENTS

CN     101160629 A     4/2008
CN     102317662 A     1/2012
(Continued)

*Primary Examiner* — Jorge L Leon, Jr.
(74) *Attorney, Agent, or Firm* — Kevin Parks

(57) ABSTRACT

A method for producing a reduced friction sliding surface on a machine element includes applying a coating comprising amorphous carbon to a surface of the machine element and locally heating the coating with a laser. The coating is heated to a temperature below an evaporation temperature of the coating to achieve a local volumetric increase in the coating and a local increase in a layer thickness of the coating. A surface structure of the coating includes a multiplicity of elevations resulting from a local phase transformation of the coating from amorphous carbon into graphite due to the locally heating.

8 Claims, 1 Drawing Sheet

(51) Int. Cl.
*F01L 1/16* (2006.01)
*F01L 1/14* (2006.01)

(52) U.S. Cl.
CPC ............... *C23C 16/56* (2013.01); *F01L 1/16* (2013.01); *F01L 1/14* (2013.01)

(58) Field of Classification Search
USPC ...................................................... 123/90.51
See application file for complete search history.

(56) References Cited

U.S. PATENT DOCUMENTS

2013/0199331 A1* 8/2013 Himsel ............... C23C 14/0641
74/569
2017/0167608 A1* 6/2017 Ooshiro .................. C23C 16/50

FOREIGN PATENT DOCUMENTS

| | | |
|---|---|---|
| DE | 19723209 A1 | 12/1997 |
| DE | 19825860 A1 | 12/1999 |
| DE | 102006029415 A1 | 1/2008 |
| DE | 102009060924 A1 | 6/2011 |
| DE | 102015221041 A1 | 7/2016 |
| JP | 01-082321 A | 3/1989 |
| JP | 2003211400 A | 7/2003 |
| JP | 2009009718 A | 1/2009 |
| JP | 2009542902 A | 12/2009 |
| JP | 2014058720 A | 4/2014 |
| JP | 2014062326 A | 4/2014 |
| WO | 0018971 A1 | 4/2000 |
| WO | 2008000573 A2 | 1/2008 |
| WO | WO-2016112904 A1 * | 7/2016 ................ F01L 1/12 |

* cited by examiner

METHOD FOR PRODUCING A SLIDING SURFACE

CROSS-REFERENCE TO RELATED APPLICATIONS

This application is the United States National Phase of PCT Appln. No. PCT/DE2018/100262 filed Mar. 23, 2018, which claims priority to German Application No. DE102017112466.7 filed Jun. 7, 2017, the entire disclosures of which are incorporated by reference herein.

TECHNICAL FIELD

The disclosure relates to a method for producing a sliding surface on a machine element. Furthermore, the disclosure also relates to a machine element having a sliding surface.

BACKGROUND

DE 10 2009 060 924 A1 describes a structure comprising a solid lubricant for a vacuum tribological application. Here, a layer system comprising a layer of diamond-like carbon is configured on a substrate base. Furthermore, a depression structure which is filled with a solid lubricant is configured in the layer system or in the substrate base and in the layer system by means of a laser interference method.

SUMMARY

Within the context of the method according to the disclosure for producing a sliding surface on a machine element, a coating is applied at least partially to a surface of the machine element, a surface structure for the reduction of friction subsequently being configured at least partially on the coating by means of laser, the surface structure comprising a multiplicity of elevations which are configured by way of a local phase transformation of the coating by means of laser.

In other words, the production of the surface structure by means of laser by way of the local phase transformation of the coating takes place after the coating of the surface of the machine element. The sliding surface of the machine element is configured by way of the elevations on the coating. In particular, the machine element is configured as a bucket tappet. The machine element may have a sliding/rolling contact with the further machine element. Furthermore, the machine element can also be configured as a lever-like cam follower for a valve train system of an internal combustion engine or as a component of a pump.

The elevations in the coating result in a reduction in friction which is dependent on the effective contact area between the two machine elements. Improved friction can be achieved, for example, by approximately 25% of the surface of the machine element being in effective contact with the further machine element. In other words, approximately one fourth of the surface of the machine element or the coating which is configured thereon is covered with elevations which are in effective contact with the further machine element. As an alternative, however, a larger or a smaller proportion of the surface of the machine element can also be covered with the elevations. The elevations may be arranged on a bucket tappet end surface and are arranged, for example, in a circular manner on a plurality of circular paths which have different diameters. Furthermore, the elevations can be arranged on the bucket tappet end surface in a spiral or randomly distributed manner, or else can also be configured in alternative forms which are arranged in a uniformly distributed or random manner. In addition, further elevations can be configured on the bucket tappet circumferential surface. In this case, the elevations can be arranged on circumferential circular paths which are arranged spaced apart axially from one another. Furthermore, the elevations can be arranged on the bucket tappet circumferential surface in a randomly distributed manner. The elevations preferably have a height of from 0.02 to 2 µm and a diameter of from 1 to 100 µm. The radial clearances between the elevations can be provided, for example, for receiving lubricant, with the result that the lubricant is held in the sliding surface between the two machine elements.

The term "at least partially" is to be understood to mean that the surface structure and the coating are configured at least on a part of the surface of the machine element. Furthermore, it is also conceivable, however, that the surface structure and the coating are configured on the entire surface of the machine element.

The coating may be applied at least partially to the surface of the machine element by way of a PVD or PACVD or CVD method. In other words, the coating is applied in accordance with a method according to PVD (Physical Vapor Deposition) or PACVD (Plasma-Assisted Chemical Vapor Deposition) or CVD (Chemical Vapor Deposition). In the PVD method, particles are detached from a target material, for example, by way of sputtering, and are transported in a plasma onto the surface of the machine element. In the case of the CVD method, the layer deposition takes place on the heated surface of the machine element on account of a chemical reaction from a gas phase. Furthermore, in the case of the PACVD method, the layer deposition takes place, for example, via a plasma excitation of a hydrocarbon-containing gas.

The coating may be configured at least partially from amorphous carbon. Furthermore, amorphous carbon is known under the designation DLC (Diamond Like Carbon). The coating may be configured at least partially from tetrahedral hydrogen-free amorphous carbon (ta-C). DLC has a comparatively high hardness, high chemical resistance and abrasion resistance, and a low coefficient of friction. By way of an energy input of the laser, the coating is heated locally as far as below the evaporation temperature, with the result that a phase transformation of the carbon in the coating takes place. Here, the $sp^3$ bonds which prevail in the amorphous carbon layer or in the ta-C layer transform partially into $sp^2$ bonds. As a result, a local volumetric increase in the coating or a local increase of the layer thickness of the coating occurs. In other words, the above-described local elevations which protrude radially out of the coating are formed. The disintegration of the $sp^3$ bonds in ta-C takes place as a rule at temperatures above 700° C., and oxidation takes place above 450° C. Graphite advantageously has relatively satisfactory lubricant properties, as a result of which the friction in the sliding surface is additionally lowered.

The exposure time of the laser, in particular of the laser pulses on the coating for the configuration of the surface structure, is in the range from femtoseconds to nanoseconds. In an example embodiment, the pulse duration of the laser is between 100 fs and 100 ns. Furthermore, the wavelength of the laser is matched to the surface of the machine element in such a way that an evaporation of the material is avoided, with the result that merely the local phase transformation can take place in the zone of action of the laser radiation. The wavelength to be set is dependent, for example, on the material of the machine element and the melting or evaporation temperature of the coating.

A coating is to be understood to mean a coating system with at least one layer. For example, a plurality of layers can also be configured at least partially above one another and/or next to one another.

BRIEF DESCRIPTION OF THE DRAWINGS

Further measures which describe the disclosure will be presented in greater detail in the following text together with the description of one exemplary embodiment on the basis of the three figures, in which.

DETAILED DESCRIPTION

Figure 1:
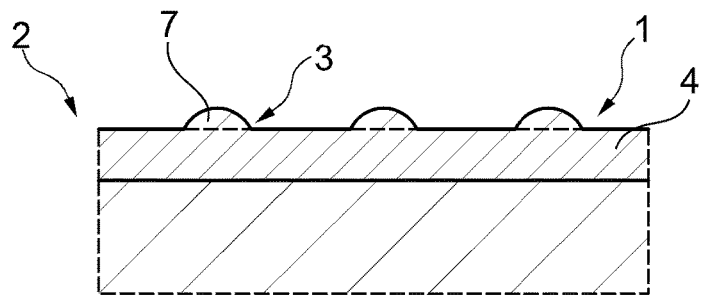
FIG. 1 shows a diagrammatic partially sectioned illustration for visualizing the construction of a sliding surface of a machine element according to the disclosure.

According to FIG. 1, a machine element 2 according to the disclosure (shown here merely partially) has a sliding surface 1 which is provided for sliding contact with at least one further machine element (not shown here). The machine element 2 has a coating 4, on which a surface structure 3 with a multiplicity of elevations 7 is configured by means of laser. The elevations 7 therefore form the sliding surface 1.

In order to produce the sliding surface 1, the coating 4 is applied to a surface of the machine element 2, the coating 4 being applied to the surface of the machine element 2 by way of a CVD method. The coating 4 is configured from tetrahedral hydrogen-free amorphous carbon. In a following step, the surface structure 3 with the elevations 7 is produced in the coating 4 by means of laser, the elevations 7 being configured by way of a local phase transformation of the coating 4 by way of the laser. The coating 4 is heated by way of the laser to a transformation temperature which leads to a local phase transformation of the amorphous carbon into graphite, the transformation temperature lying below the evaporation temperature both of the coating and of the material of the machine element 2. The elevations 7 have a respective height of from 0.02 to 2 µm and a respective diameter of from 1 to 100 µm.

Figure 2:
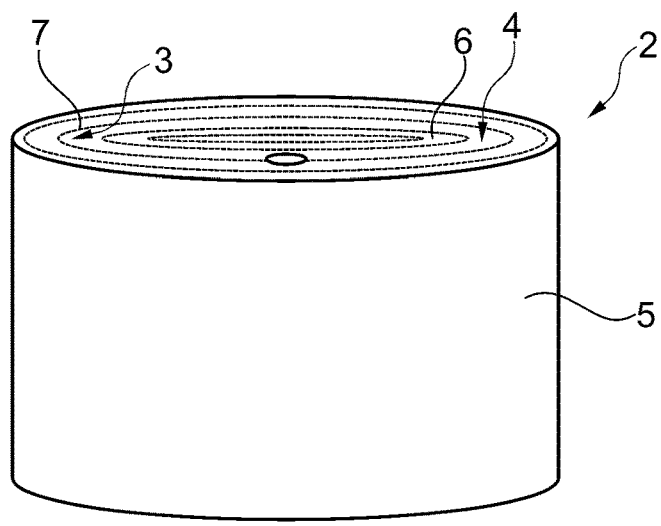
FIG. 2 shows a diagrammatic perspective illustration of the machine element according to the disclosure in accordance with FIG. 1.

According to FIG. 2, the machine element 2 according to the disclosure is configured as a bucket tappet. For the reduction of friction, a bucket tappet end surface 6 has the coating 4 made from amorphous carbon and the surface structure 3 on the coating 4. In addition, furthermore, a bucket tappet circumferential surface 5 can have, for the reduction of friction, the coating 4 consisting of tetrahedral hydrogen-free amorphous carbon and the surface structure 3 on the coating 4. The surface structure 3 was produced by means of laser by way of phase transformation in places of ta-C into a-C within the coating 4. Elevations 7 which reduce the friction on the bucket tappet end surface 6 were configured by way of a local volumetric increase of the coating 4.

Figure 3:
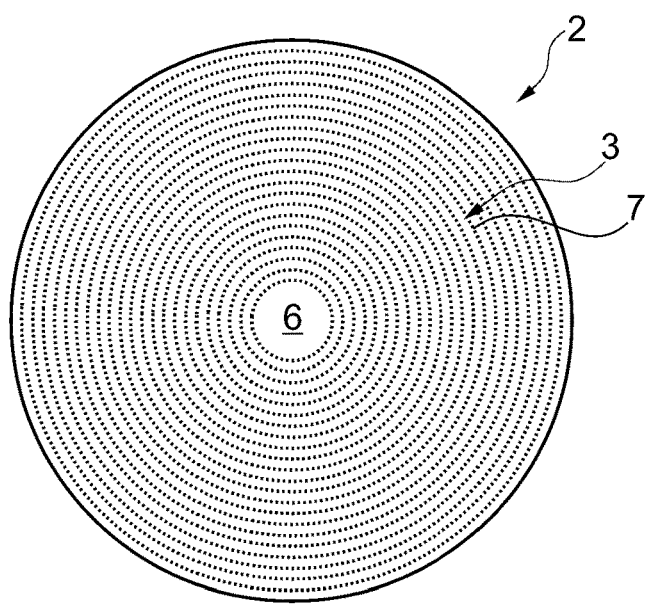
FIG. 3 shows a diagrammatic plan view of the machine element according to the disclosure in accordance with FIG. 1.

FIG. 3 shows the arrangement of the surface structure 3 in the plan view of the machine element 2 according to the disclosure. The elevations 7 are arranged radially on the bucket tappet end surface 6, the elevations 7 covering approximately 25% of the bucket tappet end surface 6.

REFERENCE NUMERALS

1 Sliding surface
2 Machine element
3 Surface structure
4 Coating
5 Bucket tappet circumferential surface
6 Bucket tappet end surface
7 Elevation

The invention claimed is:

1. A machine element, comprising:
a sliding surface configured for sliding contact with at least one further machine element, the sliding surface comprising a coating including amorphous carbon and a surface structure on the coating comprising an array of elevations,
wherein the array of elevations is formed via a laser which locally heats the coating so as to induce a local phase transformation of the amorphous carbon into graphite.

2. The machine element of claim 1, wherein the coating is configured at least partially from tetrahedral hydrogen-free amorphous carbon.

3. The machine element of claim 1, wherein the elevations have each elevation has a height of at least 0.02 µm and at most 2 µm.

4. The machine element of claim 1, wherein the elevations haveeach elevation has a respective diameter of at least 1 µm and at most 100 µm.

5. The machine element of claim 1, wherein the machine element is configured as a bucket tappet.

6. The machine element of claim 5, wherein the array of elevations are is arranged on an end surface of the bucket tappet.

7. The machine element of claim 6, wherein the array of elevations is arranged so as to form a plurality of concentric circular paths.

8. The machine element of claim 6, wherein additional elevations are arranged on a circumferential surface of the bucket tappet.

* * * * *